(12) United States Patent
Lai et al.

(10) Patent No.: US 11,139,172 B2
(45) Date of Patent: Oct. 5, 2021

(54) MANUFACTURING METHOD OF GATE STRUCTURE

(71) Applicant: Mosel Vitelic Inc., Hsinchu (TW)

(72) Inventors: Shih-Chi Lai, Hsinchu (TW);
Hung-Chih Chung, Hsinchu (TW);
Hsien-Yi Cheng, Hsinchu (TW);
Chia-Ming Kuo, Hsinchu (TW)

(73) Assignee: MOSEL VITELIC INC., Hsinchu (TW)

( * ) Notice: Subject to any disclaimer, the term of this patent is extended or adjusted under 35 U.S.C. 154(b) by 20 days.

(21) Appl. No.: 16/547,828

(22) Filed: Aug. 22, 2019

(65) Prior Publication Data

US 2020/0328084 A1 Oct. 15, 2020

(30) Foreign Application Priority Data

Apr. 11, 2019 (TW) .................................. 108112768

(51) Int. Cl.
*H01L 21/28* (2006.01)
*H01L 21/8234* (2006.01)
*H01L 29/78* (2006.01)
*H01L 29/66* (2006.01)
*H01L 29/423* (2006.01)

(52) U.S. Cl.
CPC .................. *H01L 21/28123* (2013.01); *H01L 21/823437* (2013.01); *H01L 29/4236* (2013.01); *H01L 29/66734* (2013.01); *H01L 29/7813* (2013.01)

(58) Field of Classification Search
CPC ....................................................... H01L 21/70
See application file for complete search history.

(56) References Cited

U.S. PATENT DOCUMENTS

| | | | |
|---|---|---|---|
| 6,391,699 B1 | 5/2002 | Madson et al. | |
| 6,576,954 B2 | 6/2003 | Madson et al. | |
| 7,371,641 B2 | 5/2008 | Montgomery | |
| 8,106,446 B2 | 1/2012 | Montgomery | |
| 2004/0005766 A1* | 1/2004 | Lai | H01L 21/76224 438/424 |
| 2006/0094203 A1* | 5/2006 | Choi | H01L 27/115 438/424 |
| 2006/0138522 A1* | 6/2006 | Kim | H01L 27/115 257/315 |
| 2006/0198190 A1* | 9/2006 | Lue | H01L 29/40117 365/185.12 |
| 2008/0081411 A1* | 4/2008 | Cho | H01L 27/11521 438/257 |

(Continued)

*Primary Examiner* — Jay C Chang
(74) *Attorney, Agent, or Firm* — Kirton McConkie; Evan R. Witt

(57) ABSTRACT

A manufacturing method of a gate structure includes steps of forming a mask oxide layer on the substrate, performing a photolithography process on the mask oxide layer and the substrate to form a trench, etching the trench, removing the mask oxide layer, forming a bottom oxide layer on a surface of the substrate and a trench surface of the trench, forming a silicon nitride layer on the trench, removing a part of the bottom oxide layer, removing the silicon nitride layer, forming a gate oxide layer on the surface and a part of the trench surface, and forming a poly layer on the trench. Therefore, the advantages of simplifying the gate structure process and reducing the production cost are achieved.

8 Claims, 5 Drawing Sheets

(56) References Cited

U.S. PATENT DOCUMENTS

| | | | |
|---|---|---|---|
| 2008/0138953 A1* | 6/2008 | Challa | H01L 21/30655 438/270 |
| 2008/0206976 A1* | 8/2008 | Kitamura | H01L 27/11521 438/593 |
| 2008/0233709 A1* | 9/2008 | Conti | H01L 21/31111 438/424 |
| 2010/0187602 A1 | 7/2010 | Woolsey et al. | |
| 2011/0056740 A1* | 3/2011 | Takano | H05K 3/426 174/262 |
| 2011/0156140 A1* | 6/2011 | Zara | H01L 29/4236 257/334 |
| 2012/0052673 A1* | 3/2012 | Yoo | H01L 27/11582 438/591 |
| 2012/0276713 A1* | 11/2012 | Miyahara | H01L 21/76224 438/427 |
| 2015/0325660 A1* | 11/2015 | Hitora | H01L 21/0257 257/43 |
| 2016/0064288 A1* | 3/2016 | Cheng | H01L 21/76224 257/192 |
| 2018/0166341 A1* | 6/2018 | Chan | H01L 29/66803 |
| 2020/0168719 A1* | 5/2020 | Liu | H01L 29/0696 |

* cited by examiner

MANUFACTURING METHOD OF GATE STRUCTURE

FIELD OF THE INVENTION

The present disclosure relates to a manufacturing method of a gate structure, and more particularly to a manufacturing method of a gate structure and a gate structure.

BACKGROUND OF THE INVENTION

With the development of science and technology, the Metal Oxide Semiconductor Field Effect Transistor (MOSFET) has become a common semiconductor component in integrated circuits, among which the trench MOSFET has better characteristics, and the traditional MOSFET is gradually replaced with the trench MOSFET.

Generally, in the trench MOSFET, the gate is disposed in the trench of the semiconductor substrate surface to reduce the area occupied by the gate on the semiconductor substrate surface, thereby enhancing the density of the components. One embodiment of the gate structure is a step gate, which is a gate structure in a stepped-shape.

In the conventional step gate process, there is a need to perform the trench etching step twice. More specifically, after the first trench etching, the trench is protected by depositing compounds, and then the second trench etching is performed, such that a gate structure in a stepped-shape is formed. However, this manufacturing process is minute and complicated, and the production cost is high.

For overcoming the drawbacks of the conventional technologies, there is a need of providing an improved manufacturing method of a gate structure and a gate structure.

SUMMARY OF THE INVENTION

An object of the present disclosure provides a manufacturing method of a gate structure and a gate structure to address the issues encountered by the prior arts.

In accordance with an aspect of the present disclosure, there is provided a manufacturing method of a gate structure and a gate structure. By removing a part of the bottom oxide layer, only one trench etching is needed in the manufacturing process, and thus a stepped gate structure can be form, such that the advantages of simplifying the gate structure process and reducing the production cost are achieved.

In accordance with another aspect of the present disclosure, there is provided a manufacturing method of a gate structure and a gate structure. By forming the silicon nitride layer to protect the bottom oxide layer, removing a part of the bottom oxide layer, and then further forming a gate oxide layer, the step gate structure applied in semiconductor components can be formed through a simple manufacturing process.

In an embodiment, the manufacturing method of a gate structure includes steps of: (a) forming a mask oxide layer on the substrate, performing a photolithography process on the mask oxide layer and the substrate to form a trench, and etching the trench; (b) removing the mask oxide layer; (c) forming a bottom oxide layer on a surface of the substrate and a trench surface of the trench; (d) forming a silicon nitride layer on the trench; (e) removing a part of the bottom oxide layer; (f) removing the silicon nitride layer; (g) forming a gate oxide layer on the surface and a part of the trench surface; and (h) forming a poly layer on the trench.

In an embodiment, the gate structure includes a substrate, a bottom oxide layer, a gate oxide layer and a poly layer. The substrate has a surface, and a trench is formed on the substrate. The trench has a trench surface. The bottom oxide layer is disposed on a lower end of the trench surface, and the gate oxide layer is disposed on the surface and an upper end of the trench surface. The thickness of the gate oxide layer is less than the thickness of the bottom oxide layer. The poly layer is disposed in the trench, and the poly layer is disposed on the bottom oxide layer and connected with the gate oxide layer.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1B:
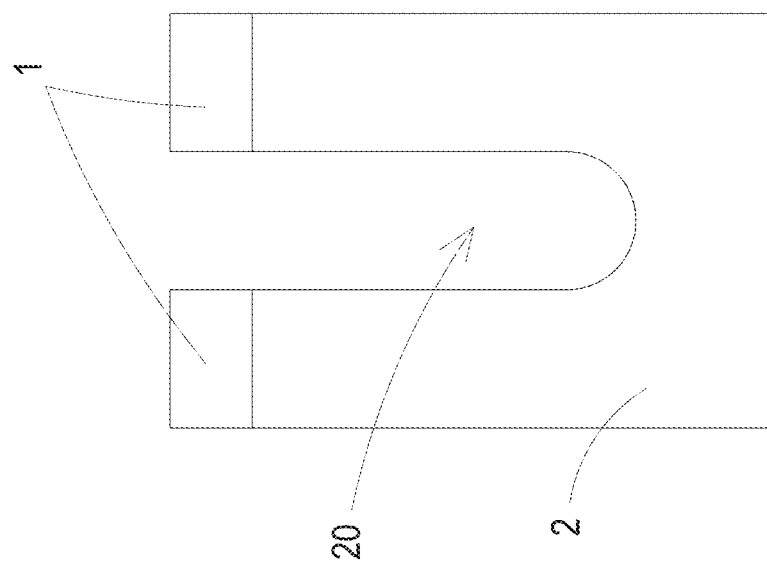
FIG. 1A to FIG. 1H schematically illustrate the flow structures of a manufacturing method of a gate structure according to an embodiment of the present disclosure.
Figure 1A:
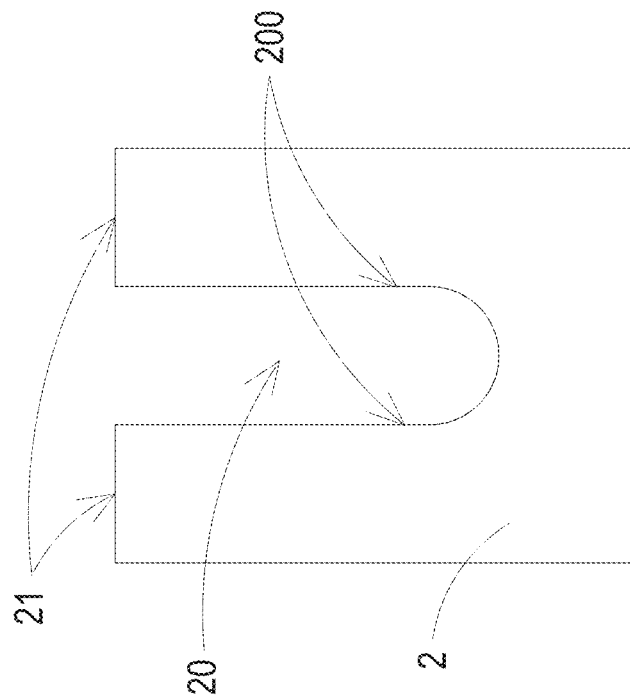
Figure 1D:
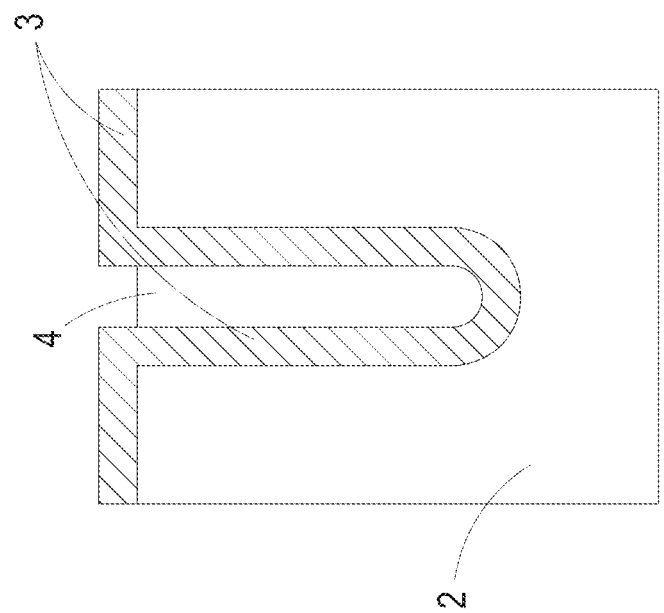
Figure 1C:
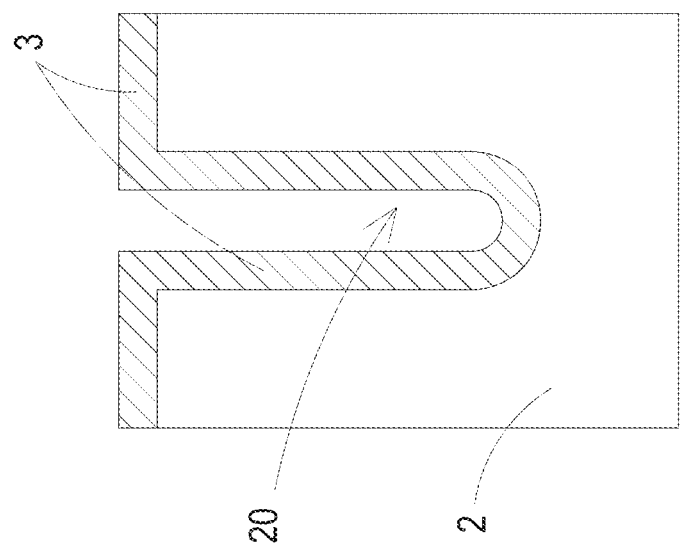
Figure 1E:
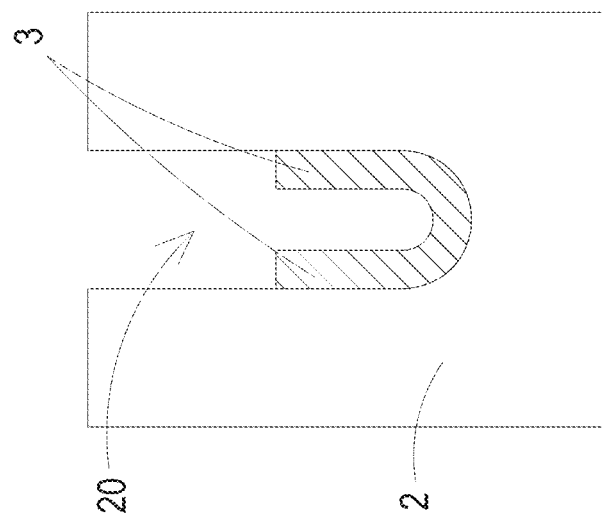
Figure 1F:
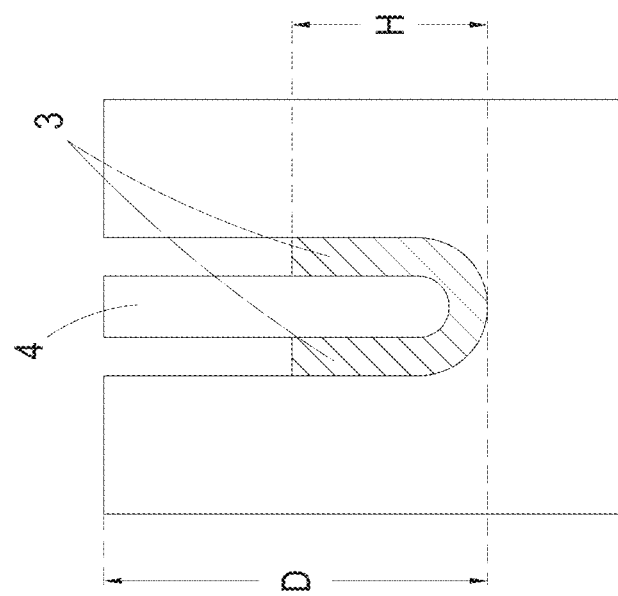
Figure 1H:
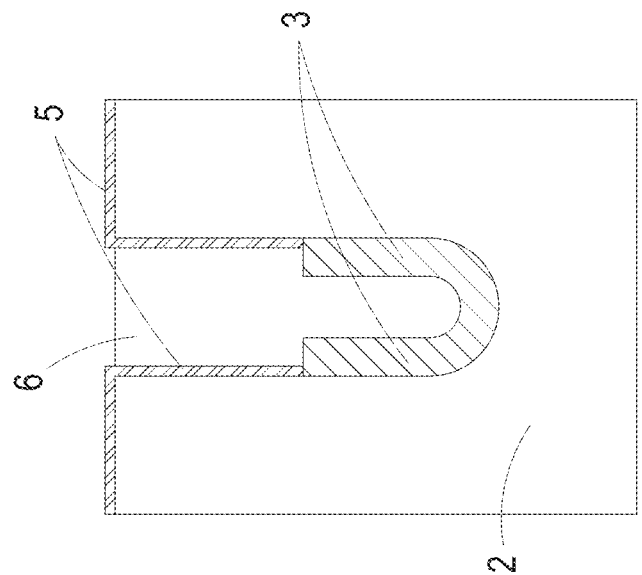
Figure 1G:
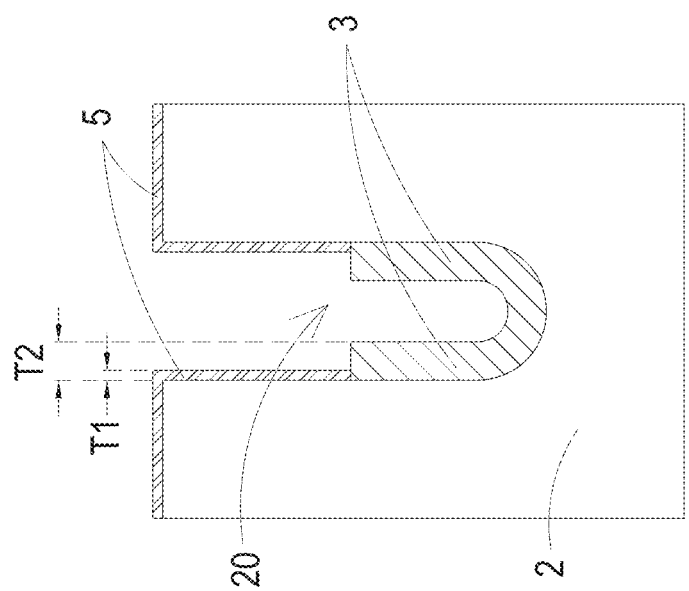

Please refer to FIG. 1A to FIG. 1H. FIG. 1A to FIG. 1H schematically illustrates the flow structures of a manufacturing method of a gate structure according to an embodiment of the present disclosure. As shown in FIG. 1A to FIG. 1H, the manufacturing method of the gate structure includes the following steps. Firstly, the mask oxide layer 1 is formed on the substrate 2, then a photolithography process is performed on the mask oxide layer 1 and the substrate 2 to form a trench 20, and the trench 20 is etched, so as to form the structure as shown in FIG. 1A. Next, the mask oxide layer 1 is removed, so as to form the structure as shown in FIG. 1B. Then, a bottom oxide layer 3 is formed on a surface 21 of the substrate 2 and a trench surface 200 of the trench 20, so as to form the structure as shown in FIG. 1C. Then, a silicon nitride layer 4 is formed on the trench 20, so as to form the structure as shown in FIG. 1D. Then, a part of the bottom oxide layer 3 is removed, so as to form the structure as shown in FIG. 1E. Then, the silicon nitride layer 4 is removed, so as to form the structure as shown in FIG. 1F. Then, a gate oxide layer 5 is formed on the surface 21 of the substrate 2 and a part of the trench surface 200, so as to form the structure as shown in FIG. 1G. Lastly, a poly layer 6, also known as a polysilicon layer, is formed on the trench 20, and finally the gate structure as shown in FIG. 1H is formed.

In other words, in the manufacturing method of the gate structure of the present disclosure, by removing a part of the bottom oxide layer, only one trench etching is needed in the manufacturing process, and thus a stepped gate structure can be form, such that the advantages of simplifying the gate structure process and reducing the production cost are achieved.

In some embodiments, the step of forming the mask oxide layer 1 on the substrate 2, performing the photolithography process on the mask oxide layer 1 and the substrate 2 to form the trench 20, and etching the trench 20 further includes the following steps. Firstly, the mask oxide layer 1 is formed on the substrate 2 by a chemical vapor deposition method. Next, the trench patterning and the photolithography process are performed on the mask oxide layer 1 and the substrate 2 to form the trench 20. Then, the etching (e.g., wet etching or chemical etching) is performed on the mask oxide layer 1. Lastly, the etching (e.g., dry etching) is performed on the trench 20, so as to form the structure as shown in FIG. 1A.

In some embodiments, in the step of forming the bottom oxide layer 3 on the surface 21 of the substrate 2 and the trench surface 200, the bottom oxide layer 3 is formed on the surface 21 and the trench surface 200 by a thermal oxidation method, thereby forming the structure as shown in FIG. 1C, but not limited herein.

In some embodiments, the step of forming the silicon nitride layer 4 on the trench 20 further includes the following steps. Firstly, the silicon nitride layer 4 is formed on the trench 20 and filled up the trench 20 by a chemical vapor deposition method, such that the silicon nitride layer 4 is formed on the bottom oxide layer 3. Then, the etching back is performed on the silicon nitride layer 4 to remove a part of the silicon nitride layer 4, so that the level surface of the silicon nitride layer 4 is flush with the surface 21 of the substrate 2, so as to form the structure as shown in FIG. 1D.

In some embodiments, in the step of removing the part of the bottom oxide layer 3, the bottom oxide layer 3 located on an upper end of the trench surface 200 is removed, and the bottom oxide layer 3 located on the surface 21 is removed, so as to form the structure as shown in FIG. 1E. Furthermore, the upper end of the trench surface 200 is referred to the end among the trench surface 200 which is closer to the surface 21, and the height H of the bottom oxide layer 3 that is remained after removing is close to and larger than half of the depth D of the trench 20, that is, H>½D, but not limited herein.

In some embodiments, in the step of forming the gate oxide layer 5 on the surface 21 of the substrate 2 and the part of the trench surface 200, the gate oxide layer 5 is formed on the surface 21 and the part of the trench surface 200 by a thermal oxidation method. More specifically, the gate oxide layer 5 is formed on the surface 21 and the upper end of the trench surface 200, so as to form the structure as shown in FIG. 1G. That is to say, the gate oxide layer 5 is formed on the surface 21 and the upper end of the trench surface 200, which are exposed because of removing the bottom oxide layer 3, such that the surface 21 and the trench surface 200 are completely covered jointly by the bottom oxide layer 3 and the gate oxide layer 5, and the thickness T1 of the formed gate oxide layer 5 is less than the thickness T2 of the bottom oxide layer 3.

In some embodiments, the step of forming the poly layer 6 on the trench 20 further includes the following steps. Firstly, the poly layer 6 is formed on the trench 20 and filled up the trench 20 by a chemical vapor deposition method, such that the poly layer 6 is formed on the bottom oxide layer 3 and connected with the gate oxide layer 5. Then, the etching back is performed on the poly layer 6 to remove a part of the poly layer 6, so that the level surface of the poly layer 6 is flush with the surface 21 of the substrate 2. Therefore, the gate structure finally formed is the structure shown in FIG. 1H.

That is to say, in the manufacturing method of the gate structure of the present disclosure, by forming the silicon nitride layer to protect the bottom oxide layer, removing a part of the bottom oxide layer, and then further forming a gate oxide layer, the step gate structure applied in semiconductor components can be formed through a simple manufacturing process.

Figure 2:
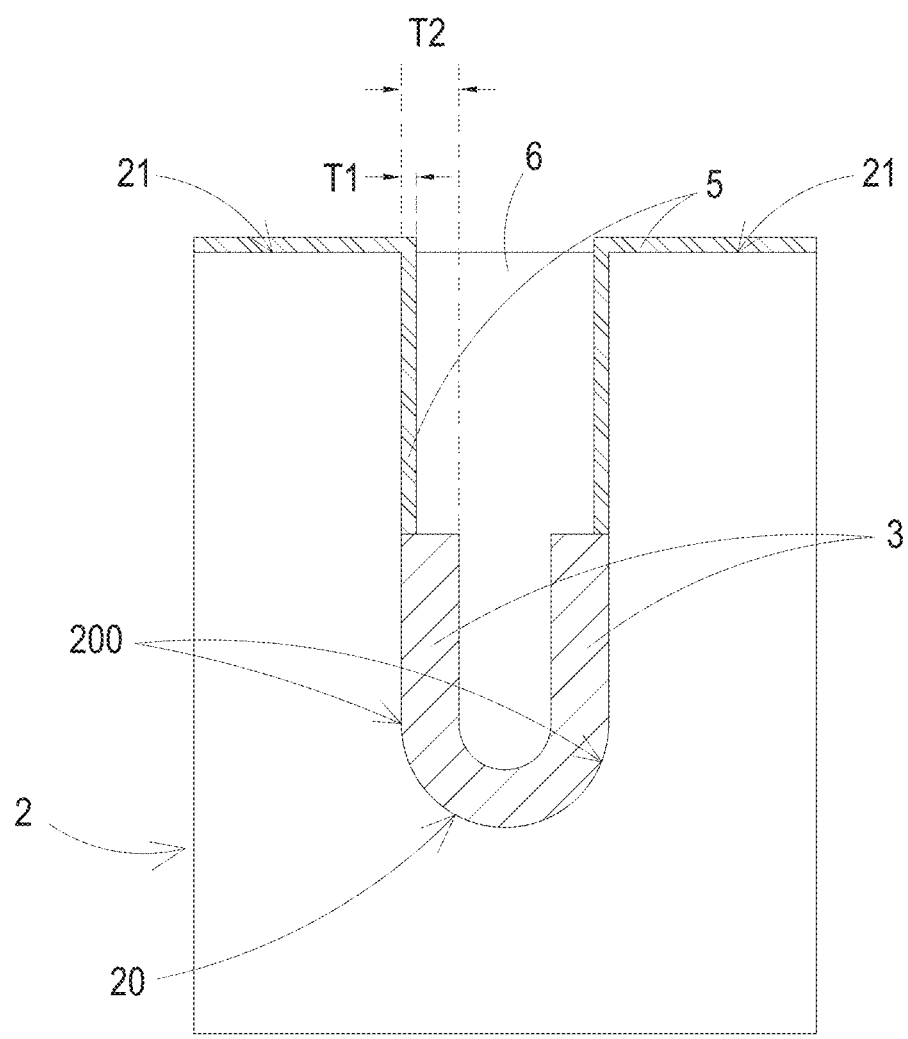
FIG. 2 schematically illustrates the structure of a gate structure according to an embodiment of the present disclosure.

Please refer to FIG. 2. FIG. 2 schematically illustrates the structure of a gate structure according to an embodiment of the present disclosure. As shown in FIG. 2, the gate structure 10 can be formed by the manufacturing method of the gate structure described above, and the gate structure 10 includes a substrate 2, a bottom oxide layer 3, a gate oxide layer 5 and a poly layer 6. Furthermore, the gate structure 10 can be applied to semiconductor components such as a trench MOSFET, but not limited herein.

The substrate 2 has a surface 21, and a trench 20 is formed on the substrate 2. The trench 20 has a trench surface 200. The bottom oxide layer 3 is disposed on a lower end of the trench surface 200, and the gate oxide layer 5 is disposed on the surface 21 of the substrate 2 and an upper end of the trench surface 200. The upper end of the trench surface 200 is referred to the end among the trench surface 200 which is closer to the surface 21 of the substrate 2, and the lower end of the trench surface 200 is referred to the end among the trench surface 200 which is closer to the bottom of the trench 20. Furthermore, the thickness T1 of the gate oxide layer 5 is less than the thickness T2 of the bottom oxide layer 3. The poly layer 6 is disposed in the trench 20, and the poly layer 6 is disposed on the bottom oxide layer 3 and connected with the gate oxide layer 5. Thus, the step gate structure with small volume and better electrical characteristics are constructed.

From the above descriptions, the present disclosure provides a manufacturing method of a gate structure and a gate structure. By removing a part of the bottom oxide layer, only one trench etching is needed in the manufacturing process, and thus a stepped gate structure can be form, such that the advantages of simplifying the gate structure process and reducing the production cost are achieved. Meanwhile, by forming the silicon nitride layer to protect the bottom oxide layer, removing a part of the bottom oxide layer, and then further forming a gate oxide layer, the step gate structure applied in semiconductor components can be formed through a simple manufacturing process.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a gate structure, comprising steps of:
   (a) forming a mask oxide layer on the substrate, performing a photolithography process on the mask oxide layer and the substrate to form a trench, and etching the trench;
   (b) removing the mask oxide layer;
   (c) forming a bottom oxide layer on a surface of the substrate and a trench surface of the trench;
   (d) forming a silicon nitride layer on the trench, comprising steps of:
      (d1) forming the silicon nitride layer on the trench and filling up the trench by a chemical vapor deposition method; and
      (d2) performing etching back on the silicon nitride layer to remove a part of the silicon nitride layer, so that a level surface of the silicon nitride layer is lower than a top surface of the bottom oxide layer disposed on the surface of the substrate and is flush with the surface of the substrate;

(e) removing a part of the bottom oxide layer;

(f) removing the silicon nitride layer;

(g) forming a gate oxide layer on the surface and a part of the trench surface; and (h) forming a poly layer on the bottom oxide layer on the trench and connecting the poly layer with the gate oxide layer.

2. The manufacturing method of the gate structure according to claim 1, wherein the step (a) comprises steps of:

(a1) forming the mask oxide layer on the substrate by a chemical vapor deposition method;

(a2) performing photolithography process on the mask oxide layer and the substrate to form the trench;

(a3) etching the mask oxide layer; and (a4) etching the trench.

3. The manufacturing method of the gate structure according to claim 1, wherein in the step (e), the bottom oxide layer located on an upper end of the trench surface and the bottom oxide layer located on the surface are removed.

4. The manufacturing method of the gate structure according to claim 3, wherein in the step (g), the gate oxide layer is formed on the surface and the upper end of the trench surface.

5. The manufacturing method of the gate structure according to claim 4, wherein in the step (g), the thickness of the gate oxide layer is less than the thickness of the bottom oxide layer.

6. The manufacturing method of the gate structure according to claim 1, wherein the step (h) comprises steps of:

(h1) forming the poly layer on the trench and filling up the trench by a chemical vapor deposition method; and (h2) performing etching back on the poly layer to remove a part of the poly layer.

7. The manufacturing method of the gate structure according to claim 1, wherein in the step (c), the bottom oxide layer is formed on the surface and the trench surface by a thermal oxidation method.

8. The manufacturing method of the gate structure according to claim 1, wherein in the step (g), the gate oxide layer is formed on the surface and the part of the trench surface by a thermal oxidation method.

\* \* \* \* \*